United States Patent [19]
Park et al.

[11] Patent Number: 5,291,127
[45] Date of Patent: Mar. 1, 1994

[54] CHIP-LIFETIME TESTING INSTRUMENT FOR SEMICONDUCTOR DEVICES

[75] Inventors: Khee Park; Jin H. Yoon; Oh S. Kwon, all of Seoul; Gi Y. Jeon, Kyungki, all of Rep. of Korea

[73] Assignee: Samsung Electronics Co., Ltd., Suweon, Rep. of Korea

[21] Appl. No.: 778,568

[22] Filed: Oct. 17, 1991

[30] Foreign Application Priority Data

May 3, 1991 [KR] Rep. of Korea .................. 91-7163

[51] Int. Cl.$^5$ .................. G01R 31/28; G01R 31/02
[52] U.S. Cl. .................. 324/158 F; 324/158 P
[58] Field of Search .............. 324/158 R, 158 F, 73.1, 324/158 P; 356/401; 358/101; 437/8; 439/480, 482, 70, 69

[56] References Cited

U.S. PATENT DOCUMENTS

| | | | |
|---|---|---|---|
| 3,702,439 | 11/1972 | McGahey et al. | 324/158 P |
| 4,161,692 | 7/1979 | Tarzwell | 324/158 P |
| 4,677,474 | 6/1987 | Sato et al. | 324/158 P |
| 4,820,975 | 4/1989 | Diggle | 324/158 P |
| 4,870,355 | 9/1989 | Kufis et al. | 324/158 F |
| 4,943,767 | 7/1990 | Yokota | 324/158 F |
| 5,055,778 | 10/1991 | Okubo et al. | 324/158 F |

FOREIGN PATENT DOCUMENTS 0293629  12/1987  Japan .................. 324/158 P

*Primary Examiner*—Vinh Nguyen
*Attorney, Agent, or Firm*—Ladas & Parry

[57] ABSTRACT

A chip-lifetime testing instrument for semiconductor devices which can detect defective chips by testing the performance and electrical lifetime of the chips in manufacturing process of the semiconductor devices, so that the manufacturing cost can be reduced and unnecessary processes for packaging of defective chips can be avoided, thereby reducing the necessary space for the set-up of the testing instrument.

7 Claims, 3 Drawing Sheets

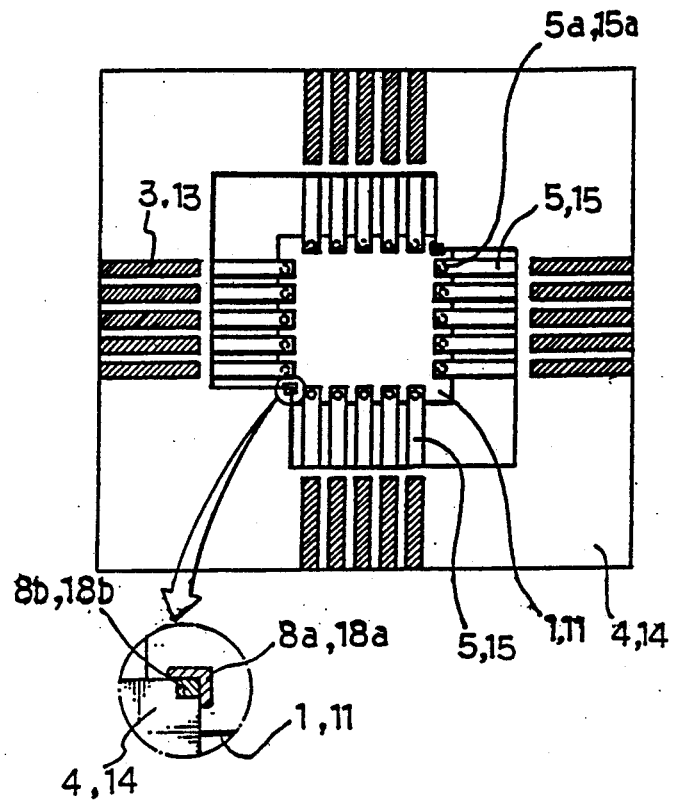
FIG. 7
FIG. 7A
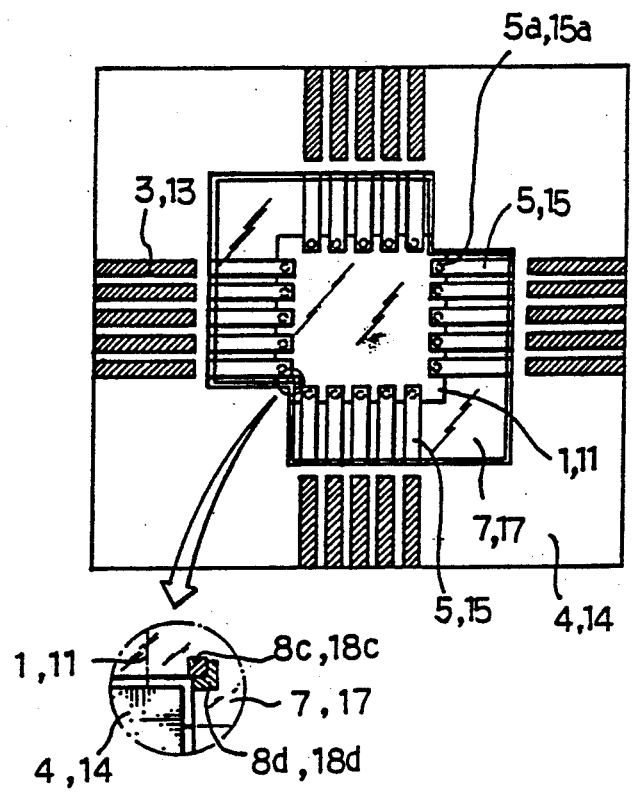
FIG. 8
FIG. 8A

CHIP-LIFETIME TESTING INSTRUMENT FOR SEMICONDUCTOR DEVICES

BACKGROUND OF THE INVENTION

The present invention relates to a semiconductor manufacturing instrument, and more particularly to, a chip-lifetime testing instrument for a semiconductor device which can detect inferior chips by testing the performance and electrical lifetime thereof in the manufacturing process of the semiconductor devices.

In general, the chip-lifetime test of semiconductor devices has been carried out after packaging chips by loading, wire-bonding, and molding processes and the test has been achieved by connecting the externally exposed leads of a package to power supplying means of a chip-lifetime testing instrument.

Since the performance and electrical lifetime test of the chip is carried out in the packaged state, therefore, unsatisfactory chips have already been packaged, reducing the efficiency of production and resulting in substantial cost such as the waste of materials due to packaging unsatisfactory chips.

Also, the testing instrument for the packaged chip must be large in order to be connected electrically to the externally exposed leads of the package. Thus, the set-up cost increases and large spaces are needed.

SUMMARY OF THE INVENTION

An object of the present invention is to provide a chip-lifetime testing instrument of semiconductor devices which carries out the performance and electrical lifetime test of a fabricated semiconductor device in a chip state before packaging so as to reduce the cost by removing unnecessary processes for packaging unsatisfactory chips and also reducing the necessary space for the set-up of the testing instrument.

According to the present invention, there is provided a chip-lifetime testing instrument for semiconductor devices, comprising: a tray having a slot for holding a chip, probes in contact with electrodes of the chip, a substrate having circuit patterns for electrical testing of the chip and connected to the end of each probe, and a clamp for fixing the substrate with respect to the tray.

Further characteristics and advantages of the present invention will become clear from the detailed description with reference to the appended drawings.

BRIEF DESCRIPTION OF THE DRAWINGS

FIG. 7 and 7A are plan views of the chip-lifetime testing instrument as shown in FIG. 2 or FIG. 5, and FIGS. 8 and 8A are plan views of the chip-lifetime testing instrument as shown in FIG. 3 or FIG. 6.

DETAILED DESCRIPTION OF THE PREFERRED EMBODIMENT

Figure 1:
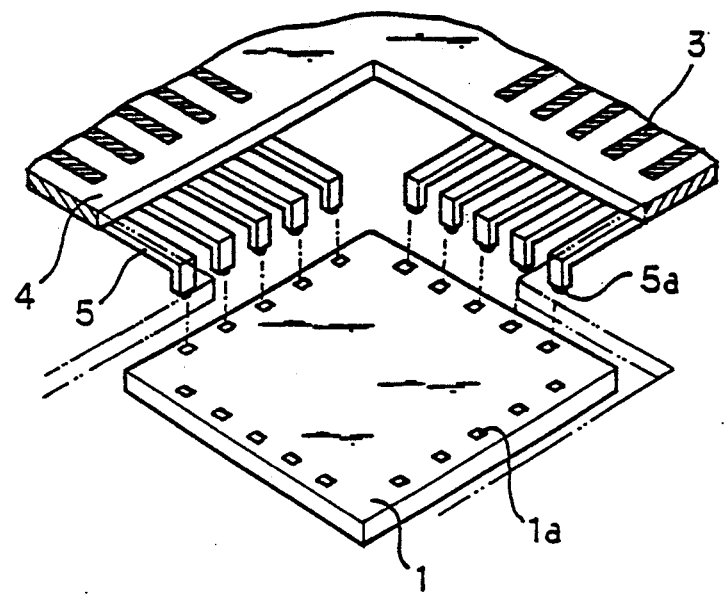
FIGS. 1-3 are perspective and cross-sectional views of a preferred embodiment of a chip-lifetime testing instrument according to the present invention.
Figure 2:
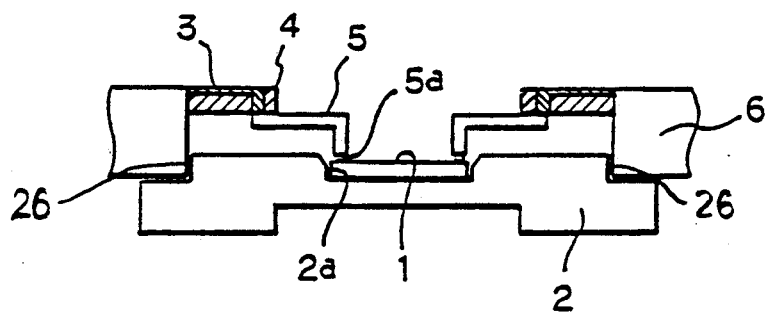

FIG. 1 and FIG. 2 show a chip-lifetime testing instrument which can carry out the chip-lifetime test of a chip 1 without forming bumps on electrodes 1a.

The chip-lifetime testing instrument comprises a tray 2 having a slot 2a to hold the chip 1 safely, a substrate 4 having circuit patterns for lifetime testing, probes 5 of which one side is connected to each circuit pattern of the substrate 4 and the other side is connected to each electrode of the chip 1 to electrically connect them to each other, and a clamp 6 for fixing the substrate 4 relative to the tray 2.

The side of each probe to be in contact with each electrode of the chip 1 is bent and tips 5a are formed at each end portion to play a buffering role against the electrode 1a of the chip 1.

Figure 3:
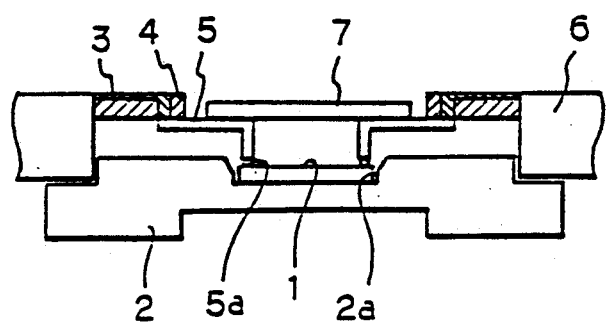

In order to accurately align the tips 5a of the probes 5 with the electrodes 1a of the chip 1, the upper sides of the probes 5 are exposed through an opening in the substrate 4 or a viewing window 7 made of a transparent material can be formed as shown in FIG. 3.

In case the upper sides of the probe 5 are open as shown in FIG. 2, various types of markings 8a and 8b are formed on predetermined positions of chip 1 and the corresponding positions of the substrate 4 as shown in FIG. 7.

Similarly, in the case of the window 7 at the upper sides of the probe 5 as shown in FIG. 3, various of markings 8c and 8d are formed on predetermined positions of chip 1 and the corresponding positions of the window 7, respectively, as shown in FIG. 8.

Figure 4:
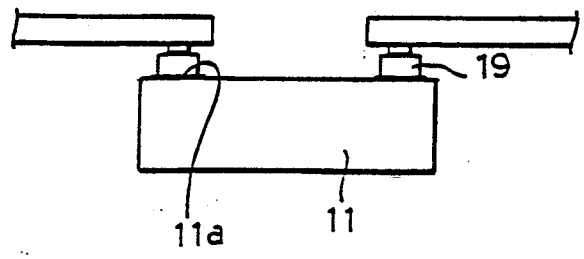
FIGS. 4-6 are cross-sectional views for illustrating the structure of another embodiment of a chip-lifetime testing instrument according to the present invention.
Figure 5:
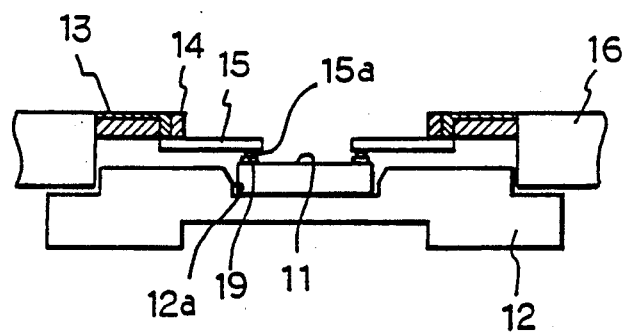

On the other hand, FIG. 4 and FIG. 5 show another chip-lifetime testing instrument in a chip 11 for which bumps 19 are formed on electrodes 11a.

This chip-lifetime testing instrument comprises a tray 12 having a slot 12a to hold a chip 11 safely, a substrate 14 having circuit patterns for lifetime testing, probes 15 of which one side is connected to each circuit pattern of the substrate 14 and the other side is connected to each bump formed on the electrode 11a of the chip 11 to electrically connect them to each other, and a clamp 16 for fixing the substrate 14.

The end portion of each probe to be in contact with the bump 19 of the chip 11 is flat and at the bottom of the end portion of each probe 5 tips 15a are formed to act a buffering role while contacting the bump 19 of the chip 11.

Figure 6:
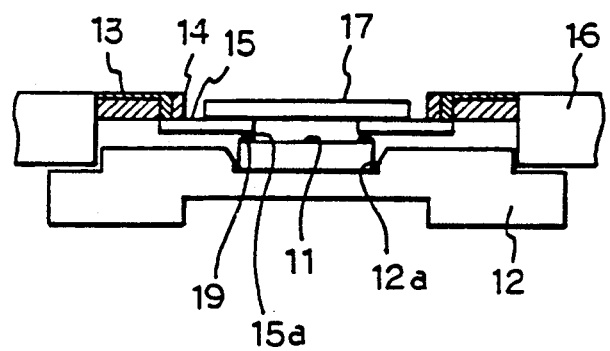

Also, a viewing window 17 can be formed on the upper side of the probes 15 as shown in FIG. 6 similarly to the instrument in which the bumps are not formed.

If the upper sides are open of the probe 15 as shown in FIG. 5, various markings 18a and 18b are formed at predetermined positions of the chip 11 and at corresponding positions of the substrate 14 as shown in FIG. 7, while in case of forming the perspective window 17 as shown in FIG. 6, markings 18c and 18d are formed at predetermined positions of the chip 11 and their corresponding positions of the window.

In the present invention described above, the chip 1 which has no bump on the electrode 1a is inserted into the slot 2a of the tray 2 as shown in FIG. 1 or FIG. 2 and, next, the tips 5a of the probes 5, which are connected to the circuit patterns 3 of the substrate, are in contact with the electrodes 1a of the chip 1 by engaging the clamp 6 in a step 26 formed in the tray 2 around the slot 2a, as shown in FIG. 2, so that the substrate 4 is fixed relative to the tray 2.

Here, the tips 5a act a buffering role so that the circuit patterns 3 are certainly connected to the chip 1 without damage on the electrodes 1a.

Since the markings 8a and 8b are formed at the predetermined positions of the chip 1 and their corresponding positions of the substrate 4, the tips 5a of the probes 5 and the electrodes 1a of the chip 1 can be easily aligned with each other by aligning the markings 8a and 8b.

Thus, the performance and lifetime test of the chip 1 are carried out simply since the electrodes 1a of the chip 1 are electrically connected to the circuit patterns 3 through the probes 5.

Also, if the perspective window 7 of the transparent material is formed at the upper side of the probe 5 as shown in FIG. 3, the chip 1 can be protected from contamination materials such as external dust during the connection state of the electrodes 1a with the tips 5a.

In addition, if the marking 8d is formed at the perspective window 7 corresponding to the marking 8c of the chip 1, the alignment for a contact with the electrodes 1a of the chip 1 and the tips 5a of the probes 5 becomes easier.

As another embodiment, in the case of forming the bumps 19 on each electrode of the chip 11 as shown in FIG. 4 and FIG. 5, the chip 11 having the bumps 19 is inserted into the slot 12a of the tray 12 and, next, the tip 15a of the probe 15 is electrically connected to the circuit patterns 13 of the substrate 14, so that the substrate 14 is fixed by the clamp 16.

At this time, the probe 15 is flat since the bump 19 is formed on the chip 11.

The tip 5a of the probe 15 is substantially in contact with the electrode 11a of the chip 11 through the bump 19 which acts the buffering role to prevent damage on the electrode 11a.

Similarly to the chip-lifetime testing instrument of the chip 1 without the bump, the markings 18a and 18b are formed at the predetermined positions of the chip 11 and the corresponding positions of the substrate 14, respectively, so that the alignment between the tip 15a of the probe 15 and the bump 19 of the chip 11 becomes easier.

Also, if the perspective window 17 is formed at the upper side of the probe 15 as shown in FIG. 6, the same effect can be obtained by forming the marking 18d at the perspective window 17 instead of the substrate 14, corresponding to the marking 18c of the chip 11.

As mentioned above, the present invention can not only prevent the loss of materials and the unnecessary process but also minimize the size of the instrument by testing the lifetime in the chip state before packaging bad chips.

What is claimed is:

1. An instrument for testing chips of semiconductor devices, comprising:
    a tray having a slot to hold a chip to be tested, said chip having an arrangement of electrodes thereon;
    a plurality of probes for contacting the electrodes on said chip;
    a substrate to which said probes are connected, said substrate having circuit patterns connected to said probes for electrical testing of said chip;
    said substrate being substantially flat and said probes projecting from said substrate substantially in the plane of said substrate, said probes having ends for contacting the electrodes;
    said substrate being selectively mountable on said tray for bringing said ends of the probes into contact with said electrodes;
    marking means on the chip and the substrate for indicating angular corresponding of the substrate and the chip and consequent correspondence of the probes and the electrodes; and
    means on said substrate for engaging said tray to align and fix the ends of said probes and said electrodes when the substrate is mounted on said tray.

2. The instrument according to claim 1, wherein said ends of the probes include downwardly bent portion with tips for contacting said electrodes.

3. The instrument according to claim 1, wherein said chips and said substrate have respective corners at both of which said marking means are placed.

4. The instrument according to claim 1, wherein said substrate includes a viewing window covering said probes.

5. The instrument according to claim 4, wherein said marking means are on both said chip and said window.

6. The instrument according to claim 1, wherein said slot is recessed in said tray.

7. The instrument according to claim 6, wherein said means on said substrate for engaging said tray includes a step around said slot and a clamp secured to said substrate and engaging in said slot upon mounting the substrate on the tray.

* * * * *

UNITED STATES PATENT AND TRADEMARK OFFICE
CERTIFICATE OF CORRECTION

PATENT NO. : 5,291,127
DATED : March 1, 1994
INVENTOR(S) : Khee Park, Jin H. Yoon, Oh S. Kwon, Gi Y. Jeon It is certified that error appears in the above-indentified patent and that said Letters Patent is hereby corrected as shown below:

On title page, left column, item 21, "778,568" should be --778,586--.

Signed and Sealed this

Ninth Day of August, 1994

Attest:

BRUCE LEHMAN

Attesting Officer     Commissioner of Patents and Trademarks